US011671138B2

(12) United States Patent
Manikandan et al.

(10) Patent No.: US 11,671,138 B2
(45) Date of Patent: Jun. 6, 2023

(54) SELF-CALIBRATING ON-OFF KEYING BASED DIGITAL ISOLATOR

(71) Applicant: Texas Instruments Incorporated, Dallas, TX (US)

(72) Inventors: RR Manikandan, Bangalore (IN); Kumar Anurag Shrivastava, Chhattisgarh (IN); Robert Floyd Payne, McKinney, TX (US); Anant Shankar Kamath, Bangalore (IN); Swaminathan Sankaran, Allen, TX (US); Kishalay Datta, Kolkata (IN); Siraj Akhtar, Richardson, TX (US); Mark Edward Wentroble, Plano, TX (US); Suvadip Banerjee, Bangalore (IN); Rakesh Hariharan, Bangalore (IN); Gurumurti Kailaschandra Avhad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/489,483

(22) Filed: Sep. 29, 2021

(65) Prior Publication Data

US 2023/0025757 A1 Jan. 26, 2023

Related U.S. Application Data

(60) Provisional application No. 63/223,704, filed on Jul. 20, 2021.

(51) Int. Cl.
*H03K 5/24* (2006.01)
*H04B 1/44* (2006.01)
(Continued)

(52) U.S. Cl.
CPC ............... *H04B 1/44* (2013.01); *H03K 3/017* (2013.01); *H03K 5/24* (2013.01); *H04L 27/04* (2013.01); *H04L 27/066* (2013.01)

(58) Field of Classification Search
CPC ........ H03K 3/017; H03K 3/0233; H03K 5/24; H04B 1/10; H04B 1/16; H04B 1/44;
(Continued)

(56) References Cited

U.S. PATENT DOCUMENTS

2019/0278245 A1* 9/2019 Singh .................. G01R 31/317
2021/0152167 A1* 5/2021 Doppalapudi ........... H03K 7/08
2022/0116249 A1* 4/2022 Briseno-Vidrios ..... H04L 27/08

* cited by examiner

*Primary Examiner* — Shawkat M Ali
(74) *Attorney, Agent, or Firm* — Valerie M. Davis; Frank D. Cimino

(57) ABSTRACT

In described examples, an integrated circuit includes an on-off keying (OOK) digital isolator, which includes a first circuitry, a multiplexer, an OOK modulator, an isolation barrier, an OOK envelope detector, and a second circuitry. The first circuitry generates and outputs a calibration signal. The multiplexer has a data signal input, and an input coupled to a first circuitry output. An OOK modulator input is coupled to a multiplexer output. An isolation barrier input is coupled to an OOK modulator output. An OOK envelope detector input is coupled to an isolation barrier output. The second circuitry includes an input coupled to an OOK envelope detector output, and an output coupled to an OOK envelope detector control input. The second circuitry detects a duty cycle distortion (DCD) of the OOK envelope detector output, and outputs a control signal to change the OOK envelope detector output's duty cycle based on the detected DCD.

20 Claims, 5 Drawing Sheets

(51) Int. Cl.
*H03K 3/017* (2006.01)
*H04L 27/06* (2006.01)
*H04L 27/04* (2006.01)

(58) Field of Classification Search
CPC ........... H04B 3/46; H04L 25/02; H04L 27/00; H04L 27/04; H04L 27/06; H04L 27/066
USPC ....... 375/219, 295–297, 316; 455/343.1, 574
See application file for complete search history.

TO FIG. 1B
100
TRANSMITTER SIDE
102
ISOLATION BARRIER
166
136
138a
138b
140a
140b
142a
142b
134a
134b
144
146
148a
150
152a
154
OOK MODULATOR
132
LC OSCILLATOR
128
130a
130b
CML TO CMOS CONVERTER
124
126
CML BUFFER
120
122a
122b
ANALOG MUX
118
119a
119b
116a
116b
114a
114b
CML DIVIDER
112
CALIBRATION OSCILLATOR
108
110a
110b
115
ENABLE
106

100
ISOLATION BARRIER
150
156
164a
165a
148b
154
152b
158
164b
165b
162a
162b
160
166
168
OOK ENVELOPE DETECTOR
170
172
SINGLE ENDED TO DIFFERENTIAL CONVERTER
174a
174b
176
LVDS BUFFER
178a
178b
194
192
DIGITAL-TO-ANALOG CONVERTER
180
LOW PASS FILTER
190
182b
182a
DIGITAL CONTROLLER
PREAMPLIFIER/ COMPARATOR
186
188
184
196
RECEIVER SIDE
104
FROM FIG. 1A

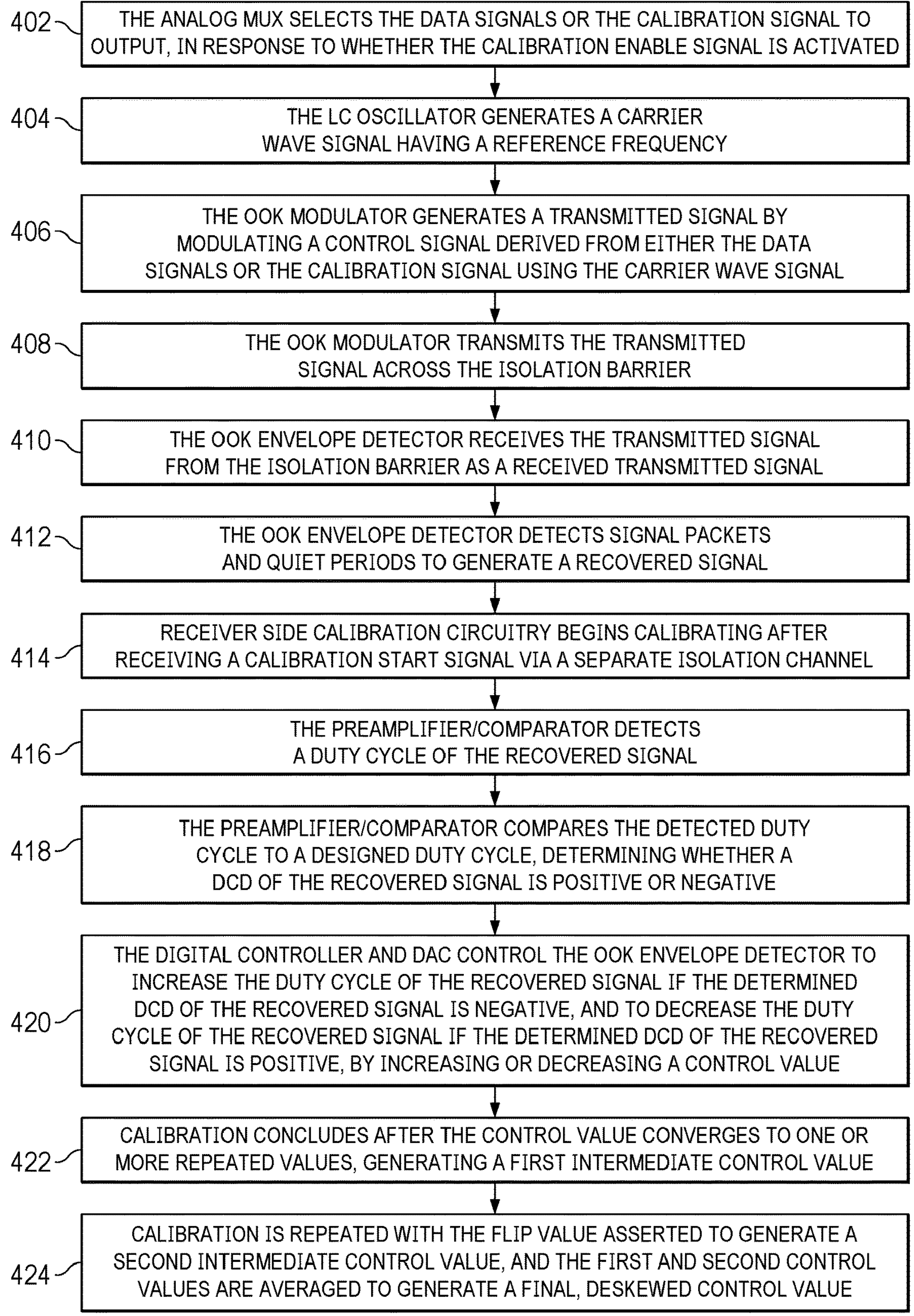
400
FIG. 4
402
THE ANALOG MUX SELECTS THE DATA SIGNALS OR THE CALIBRATION SIGNAL TO OUTPUT, IN RESPONSE TO WHETHER THE CALIBRATION ENABLE SIGNAL IS ACTIVATED
404
THE LC OSCILLATOR GENERATES A CARRIER WAVE SIGNAL HAVING A REFERENCE FREQUENCY
406
THE OOK MODULATOR GENERATES A TRANSMITTED SIGNAL BY MODULATING A CONTROL SIGNAL DERIVED FROM EITHER THE DATA SIGNALS OR THE CALIBRATION SIGNAL USING THE CARRIER WAVE SIGNAL
408
THE OOK MODULATOR TRANSMITS THE TRANSMITTED SIGNAL ACROSS THE ISOLATION BARRIER
410
THE OOK ENVELOPE DETECTOR RECEIVES THE TRANSMITTED SIGNAL FROM THE ISOLATION BARRIER AS A RECEIVED TRANSMITTED SIGNAL
412
THE OOK ENVELOPE DETECTOR DETECTS SIGNAL PACKETS AND QUIET PERIODS TO GENERATE A RECOVERED SIGNAL
414
RECEIVER SIDE CALIBRATION CIRCUITRY BEGINS CALIBRATING AFTER RECEIVING A CALIBRATION START SIGNAL VIA A SEPARATE ISOLATION CHANNEL
416
THE PREAMPLIFIER/COMPARATOR DETECTS A DUTY CYCLE OF THE RECOVERED SIGNAL
418
THE PREAMPLIFIER/COMPARATOR COMPARES THE DETECTED DUTY CYCLE TO A DESIGNED DUTY CYCLE, DETERMINING WHETHER A DCD OF THE RECOVERED SIGNAL IS POSITIVE OR NEGATIVE
420
THE DIGITAL CONTROLLER AND DAC CONTROL THE OOK ENVELOPE DETECTOR TO INCREASE THE DUTY CYCLE OF THE RECOVERED SIGNAL IF THE DETERMINED DCD OF THE RECOVERED SIGNAL IS NEGATIVE, AND TO DECREASE THE DUTY CYCLE OF THE RECOVERED SIGNAL IF THE DETERMINED DCD OF THE RECOVERED SIGNAL IS POSITIVE, BY INCREASING OR DECREASING A CONTROL VALUE
422
CALIBRATION CONCLUDES AFTER THE CONTROL VALUE CONVERGES TO ONE OR MORE REPEATED VALUES, GENERATING A FIRST INTERMEDIATE CONTROL VALUE
424
CALIBRATION IS REPEATED WITH THE FLIP VALUE ASSERTED TO GENERATE A SECOND INTERMEDIATE CONTROL VALUE, AND THE FIRST AND SECOND CONTROL VALUES ARE AVERAGED TO GENERATE A FINAL, DESKEWED CONTROL VALUE

SELF-CALIBRATING ON-OFF KEYING BASED DIGITAL ISOLATOR

CROSS REFERENCE

This application is a non-provisional of, and claims priority to, U.S. Provisional Patent Application No. 63/223,704, filed Jul. 20, 2021, which is incorporated herein by reference.

TECHNICAL FIELD

This application relates generally to digital isolators, and more particularly to on-off keyed digital isolators.

BACKGROUND

A digital isolator is a device incorporated into an integrated circuit (IC), used to isolate digital signals and/or used to isolate certain circuitry (that may operate at a higher voltage and/or current) from other circuitry. Digital communications, such as data, may be transmitted across the isolation barrier. A digital isolator provides galvanic isolation, protecting electronics from undesired influences of other circuits or circuit sections. An on-off keying (OOK) digital isolator modulates a digital input signal to be transferred across the isolation barrier using a carrier signal (e.g., a periodic oscillating waveform). Accordingly, the carrier signal is modulated by the data, using OOK, such that the carrier signal is present when the data is a logic "1" (for example) and is not present (or zero volts) when the data is a logic "0". This modulated carrier signal is transmitted across the isolation barrier. In other words, the transmitted data is represented as the presence or absence of the carrier wave, corresponding to a transmitter side transmitting during an ON portion of a data input signal period, and not transmitting during an OFF portion of the data input signal period.

SUMMARY

In described examples, an integrated circuit includes an on-off keying (OOK) digital isolator, which includes a first circuitry, a multiplexer, an OOK modulator, an isolation barrier, an OOK envelope detector, and a second circuitry. The first circuitry generates and outputs a calibration signal. The multiplexer has a data signal input, and an input coupled to a first circuitry output. An OOK modulator input is coupled to a multiplexer output. An isolation barrier input is coupled to an OOK modulator output. An OOK envelope detector input is coupled to an isolation barrier output. The second circuitry includes an input coupled to an OOK envelope detector output, and an output coupled to an OOK envelope detector control input. The second circuitry detects a duty cycle distortion (DCD) of the OOK envelope detector output, and outputs a control signal to change the OOK envelope detector output's duty cycle based on the detected DCD.

BRIEF DESCRIPTION OF THE DRAWINGS

FIG. 4 shows an example process for transmitting data through the OOK digital isolator of FIGS. 1A and 1B.

DETAILED DESCRIPTION

Figure 1A:
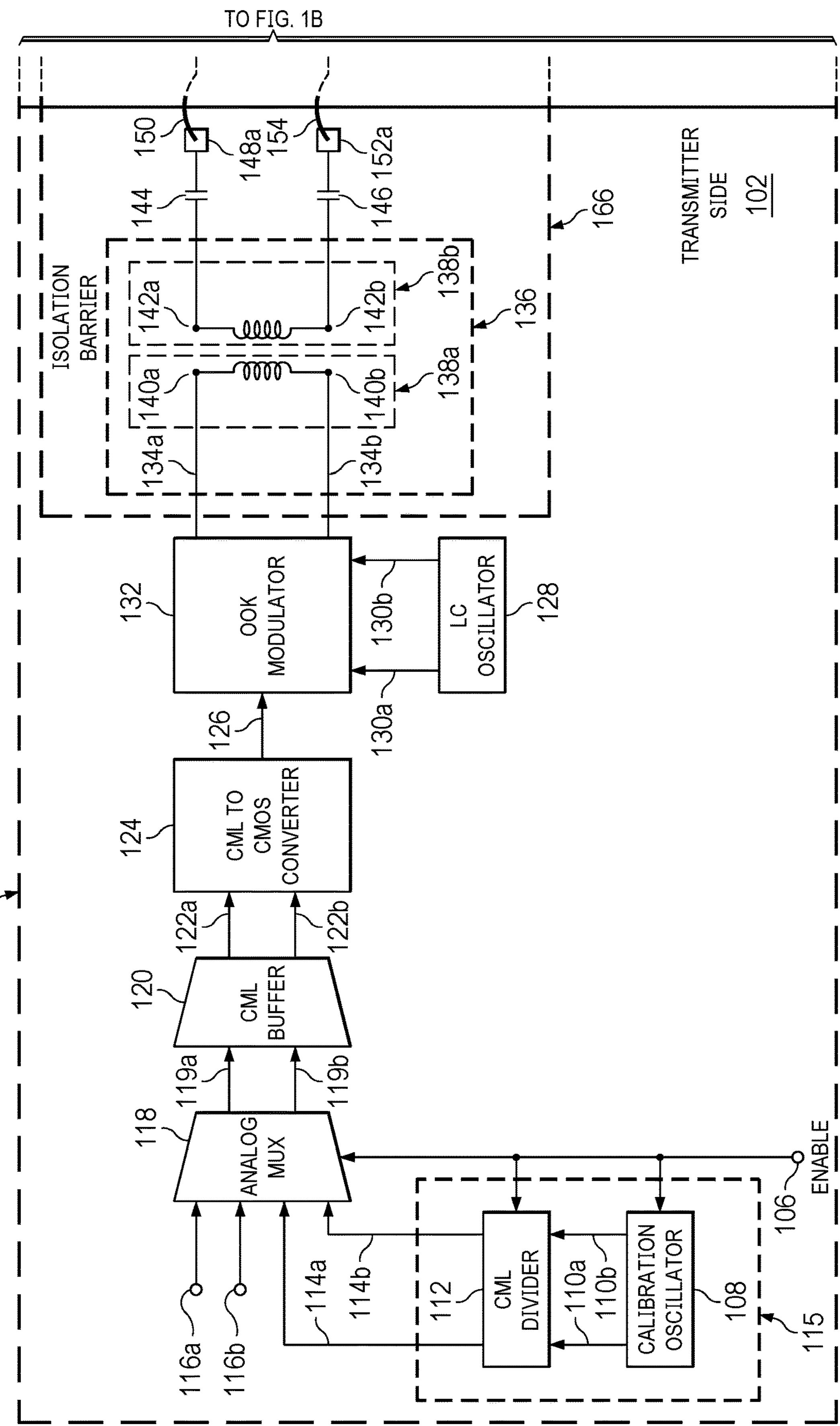
FIG. 1A shows an example block diagram of an OOK digital isolator, continued in FIG. 1B.
Figure 1B:
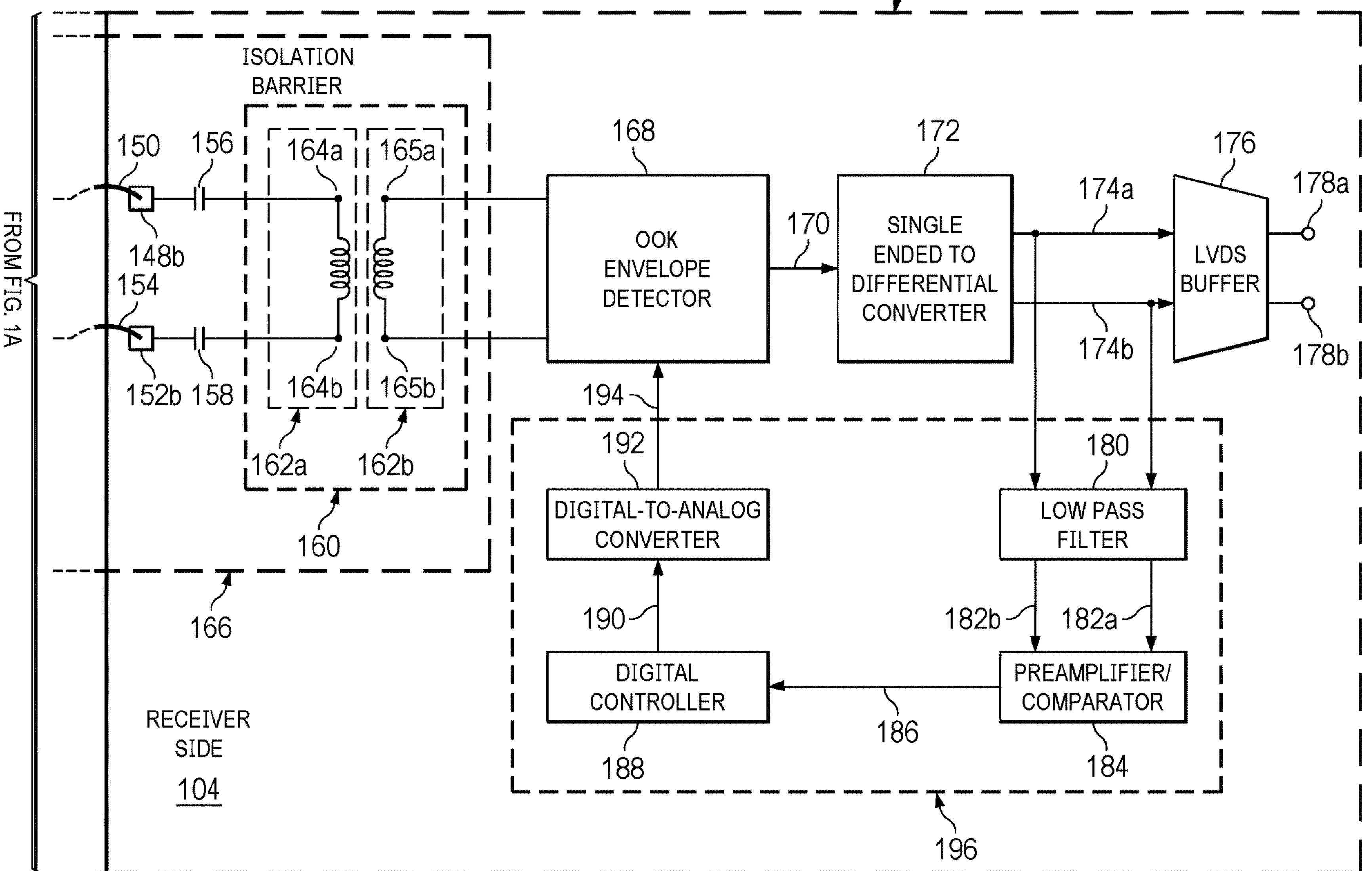
FIG. 1B shows an example block diagram of an OOK digital isolator, continued from FIG. 1A.

FIGS. 1A and 1B together show an example block diagram of an OOK digital isolator 100. (The drawing of FIG. 1A is continued into FIG. 1B due to the size and complexity of the diagram.) The OOK digital isolator 100 has a transmitter side 102 and a receiver side 104. The transmitter side 102 includes a calibration enable terminal 106 that receives a calibration enable signal. A calibration oscillator 108 has a calibration enable input connected to the calibration enable terminal 106, and has two calibration oscillator outputs 110*a* and 110*b*. A common mode logic divider (CML divider) 112 has two divider inputs connected respectively to the calibration oscillator outputs 110*a* and 110*b*, a calibration enable input connected to the calibration enable terminal 106, and two divider outputs 114*a* and 114*b*. The CML reduces duty cycle distortion (DCD), which is further discussed below with respect to FIG. 2. Together, the calibration oscillator 108 and the CML divider 112 comprise a transmitter side calibration circuitry 115.

There are two data terminals 116*a* and 116*b* configured to receive differential input data signals in a low-voltage differential signaling (LVDS) format. Data received by the data terminals 116*a* and 116*b* corresponds to digital data to be transmitted across an isolation barrier 166. A multiplexer (e.g., an analog MUX) 118 has two data inputs connected to respective ones of the data terminals 116*a* and 116*b*. The analog MUX 118 also has two clock inputs connected to respective ones of the divider outputs 114*a* and 114*b*; a calibration enable input connected to the calibration enable terminal 106; and two MUX outputs 119*a* and 119*b*. In some examples, outputs 119*a* and 119*b* are differential outputs.

A CIVIL buffer 120 has two buffer inputs connected to respective ones of the MUX outputs 119*a* and 119*b*, and has two buffer outputs 122*a* and 122*b*. A CIVIL to CMOS converter 124 has two converter inputs connected to respective ones of the buffer outputs 122*a* and 122*b*, and has one control signal output 126 that outputs a control signal.

An LC oscillator 128 has two LC oscillator outputs 130*a* and 130*b* that are differential outputs. One of the LC oscillator outputs 130 is OSCP (oscillator plus, a non-inverted output of the LC oscillator's 128 differential pair of outputs 130) and the other is OSCM (oscillator minus, an inverted output of the LC oscillator's 128 differential pair of outputs 130). The LC oscillator 128 outputs a differential carrier signal with a reference frequency Fref, for example, 14.5 GHz. In some examples, the LC oscillator outputs 130 have the same frequency but are 180 degrees out-of-phase.

An OOK modulator 132 has two carrier signal inputs, a control signal input, a first OOK modulated output 134*a*, and a second OOK modulated output 134*b*. The carrier signal inputs are connected to respective ones of the LC oscillator outputs 130*a* and 130*b*. The control signal output 126 controls the OOK modulator 132 to output the carrier signal (e.g., when it is modulated with data that is a logic "1") or not to output the carrier signal (e.g., when it is modulated with data that is a logic "0"). The OOK modulator 132 may also provide power amplification. The OOK modulator's 132 modulating function can also be viewed as signal mixing, in which the control signal input waveform is (separately) multiplied by each of the two, differential carrier signal waveforms to generate the first and second OOK modulated outputs 134*a* and 134*b*.

A transmitter side inductor/transformer 136 includes two coils, namely, a transmitter input side coil/inductor 138*a* and a transmitter output side coil/inductor 138*b* that is, for example, inductively coupled to the input side coil/inductor 138*a*. The transmitter input side coil 138*a* has a first transmitter input side terminal 140*a* and a second transmitter input side terminal 140*b*. The first transmitter input side terminal 140*a* is connected to the first OOK modulated output 134*a*. The second transmitter input side terminal 140*b* is connected to the second OOK modulated output 134*b*. The transmitter output side coil 138*b* has a first transmitter output side terminal 142*a* and a second transmitter output side terminal 142*b*.

The first transmitter output side terminal 142*a* is connected to a first plate of a first isolation capacitor 144, and the second transmitter output side terminal 142*b* is connected to a first plate of a second isolation capacitor 146. A second plate of the first isolation capacitor 144 is connected to a first bond pad 148*a*. A first wire bond 150 electrically connects the first bond pad 148*a* to a second bond pad 148*b*. A second plate of the second isolation capacitor 146 is connected to a third bond pad 152*a*. A second wire bond 154 electrically connects the third bond pad 152*a* to a fourth bond pad 152*b*. The second bond pad 148*b* is connected to a first plate of a third isolation capacitor 156. The fourth bond pad 152*b* is connected to a first plate of a fourth isolation capacitor 158. The first, second, third, and fourth isolation capacitors 144, 146, 156, and 158 each have a capacitance $C_{ISO}$. In other examples, isolation capacitors 144, 146, 156, and 158 have different capacitances. The first and second wire bonds 150 and 154 each have an inductance $L_{BOND}$. These capacitances and inductances contribute to the isolation properties (isolating noise and transient voltage and current swings) of the isolation barrier 166.

A receiver side inductor/transformer 160 includes two coils/inductors, a receiver input side coil 162*a* and a receiver output side coil 162*b*, that is, for example, inductively coupled to receiver input side coil 162*a*. The receiver input side coil 162*a* has a first receiver input side terminal 164*a* and a second receiver input side terminal 164*b*. A second plate of the third isolation capacitor 156 is connected to the first receiver input side terminal 164*a*, and the second plate of the fourth isolation capacitor 158 is connected to the second receiver input side terminal 164*b*. The receiver output side coil 162*b* has a first receiver output side terminal 165*a* and a second receiver output side terminal 165*b*. Together, the transmitter and receiver side inductors/transformers 136 and 160, the first, second, third, and fourth isolation capacitors 144, 146, 156, and 158, the first and second bond pads 148*a* and 148*b* and the first wire bond 150, and the third and fourth bond pads 152*a* and 152*b* and the second wire bond 154, comprise the isolation barrier 166.

An OOK envelope detector 168 has a first detector input, a second detector input, a detector control input 194, and a detector output 170. The first detector input is connected to the first receiver output side terminal 165*a*, and the second detector input is connected to the second receiver output side terminal 165*b*. A single ended to differential converter 172 has a converter input, a first (non-inverted) converter output 174*a*, and a second converter output 174*b* that is an inverted output. Accordingly, the second converter output 174*b* equals the first converter output 174*a* after being logically inverted, so that a voltage corresponding to a zero logical value becomes a voltage corresponding to a one logical value, and a voltage corresponding to a one logical value becomes a voltage corresponding to a zero logical value. Accordingly, the first and second converter outputs 174*a* and 174*b* are complementary CMOS signals.

A low voltage differential signaling (LVDS) buffer 176 has a first LVDS input connected to the first converter output 174*a*, and a second LVDS input connected to the second converter output 174*b*. The LVDS buffer 176 also has a first LVDS output corresponding to the first converter output 174*a* after being LVDS buffered, and has a second LVDS output corresponding to the second converter output 174*b* after being LVDS buffered. The first LVDS output is connected to a first output terminal 178*a*, and the second LVDS output is connected to a second output terminal 178*b*. The first and second output terminals 178*a* and 178*b* are the outputs of the OOK digital isolator 100. The LVDS buffer 176 generates CIVIL output signals in response to the complementary CMOS signals received from the single ended to differential converter 172.

A low pass filter (LPF) 180 (which may be implemented using an analog filter or a digital filter) has a first LPF input connected to the first converter output 174*a*, and a second LPF input connected to the second converter output 174*b*. The LPF 180 also has a first LPF output 182*a* and a second LPF output 182*b*. A preamplifier/comparator block 184 has a first preamplifier/comparator input connected to the first LPF output 182*a*, and a second preamplifier/comparator input connected to the second LPF output 182*b*. The preamplifier/comparator block 184 also has a preamplifier/comparator output 186.

A digital controller 188 has a digital controller input connected to the preamplifier/comparator output 186, and has a digital controller output 190. A digital-to-analog converter (DAC) 192 has a DAC input and a DAC output 194. The DAC 192 is, for example, a voltage DAC or a current DAC (outputting a signal with either voltage or current responsive to the DAC input), depending on whether the output of the OOK envelope detector 168 is controlled by a control signal voltage or control signal current. This can correspond to, for example, whether the OOK envelope detector 168 outputs a signal in which data is encoded in voltage or current, respectively. The OOK envelope detector control input is connected to the DAC output 194. Together, the LPF 180, preamplifier/comparator block 184, digital controller 186, and DAC 192 comprise a receiver side calibration circuitry 196.

The OOK digital isolator 100 operates in a normal mode when the calibration enable signal has a not-enabled value (/ENABLE signal), and it operates in a calibration mode when the calibration signal has an enabled value (ENABLE signal). The/ENABLE signal turns off the calibration oscillator 108 and the CML divider 112, and causes the analog MUX 118 to pass the input data signals received by the data terminals 116*a* and 116*b* to the CML buffer 120. The ENABLE signal turns on the calibration oscillator 108 and the CML divider 112, and causes the analog MUX 118 to pass the divider outputs 114*a* and 114*b*. Normal mode operation, then calibration mode operation, will be described with reference to the signal timing chart 200 shown in FIG. 2

Figure 2:
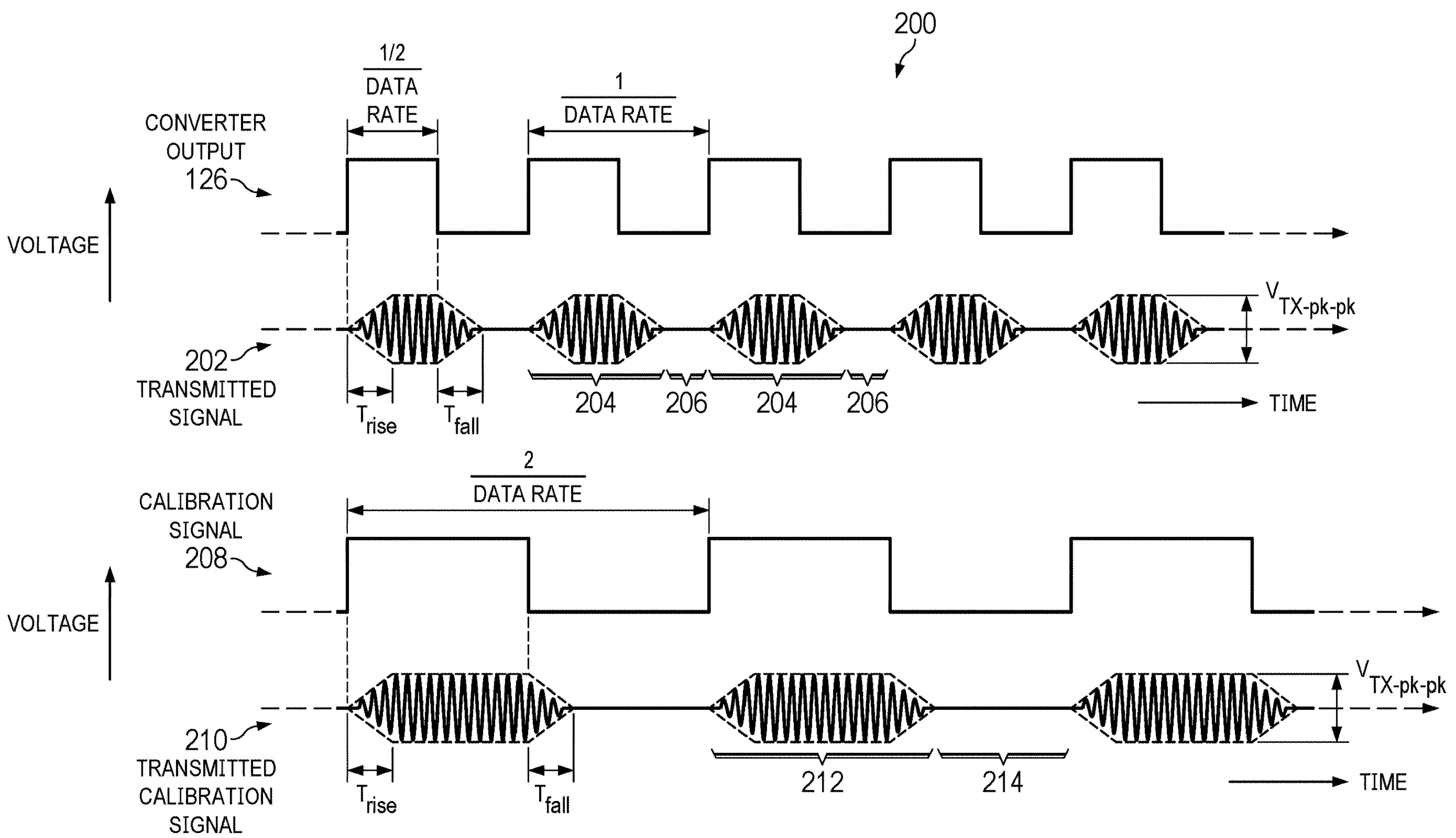
FIG. 2 shows a signal timing diagram showing example signal timings for the OOK digital isolator of FIGS. 1A and 1B.

FIG. 2 shows a signal timing diagram 200 showing example signal timings for the OOK digital isolator 100 of FIGS. 1A and 1B. During normal mode operation, the calibration enable terminal 106 provides the/ENABLE signal, turning off the calibration oscillator 108 and the CML divider 112, and selecting the data signals received from the data terminals 116*a* and 116*b* as outputs of the analog MUX 118. The CIVIL buffer 120 buffers the data signals output by the analog MUX 118, and passes them to the CML to CMOS converter 124. Data arrives via the input data signals at a data rate; accordingly, data arrives (signal periods that each express a logical value are received) at a frequency of data rate, and with a period of 1/data rate. For example, the period can be 2 nanoseconds. The CIVIL to CMOS converter 124 converts the buffer outputs 122*a* and 122*b* from two CML signals (differential signals, which can be viewed as a non-inverted signal and an inverted signal) to a single ended CMOS signal for use as a control signal for the OOK modulator 132. The output of the CIVIL to CMOS converter 124 is a square wave signal with rising edge and falling edge timing corresponding to the data values represented by the input data. As described above, the LC oscillator 128 outputs a signal with frequency Fref to the OOK modulator 132.

When a value of the converter output 126 (for example, a relatively high voltage value or a relatively low voltage value) corresponds to an on state (e.g. a logic high or a logic "1" value) of the OOK modulator 132, the OOK modulator 132 transmits a transmitted signal 202 with frequency Fref and peak-to-peak voltage $V_{TX\text{-}pk\text{-}pk}$ across the isolation barrier 166. When the value of the converter output 126 corresponds to an off state (e.g. a logic low or a logic "0" value) of the OOK modulator 132, the OOK modulator 132 does not transmit a signal across the isolation barrier 166. Accordingly, the converter output 126 acts as a control signal for the OOK modulator 132.

The OOK envelope detector 168 receives the transmitted signal 202. The peak-to-peak voltage of the signal received by the OOK envelope detector 168 $V_{RX\text{-}pk\text{-}pk}$ may be different from $V_{TX\text{-}pk\text{-}pk}$. The OOK envelope detector 168 converts the received transmitted signal 202 back into a digital (square wave) signal. Accordingly, the OOK envelope detector 168 detects when a signal with frequency Fref is present or not. If the signal is present, the OOK envelope detector 168 outputs a first voltage value (for example, a voltage value corresponding to a logical one), and if the signal is not present, the OOK envelope detector 168 outputs a second voltage value (for example, a voltage value corresponding to a logical zero). A transmitted signal 202 portion corresponding to a signal that is present is referred to herein as a signal packet 204. A quiet period 206 between signal packets 204 corresponds to periods when OOK modulator 132 signal transmission is off. The single ended to differential converter 172 converts the detector output 170 to differential CMOS signals, and the LVDS buffer 176 converts the converter outputs 174*a* and 174*b* to CML signals.

The transmitted signal 202 has a rise time $T_{rise}$, corresponding to the OOK modulator 132 being switched on by the converter output 126, and a fall time $T_{fall}$, corresponding to the OOK modulator 132 being switched off by the converter output 126. During at least some portion of the received transmitted signal 202, corresponding to at least some portion of $T_{rise}$ and $T_{fall}$, the OOK envelope detector 168 cannot accurately detect the presence or absence of the transmitted signal 202 because the transmitted signal 202 has not reached either its maximum value or minimum value, and, concurrently, the logic value corresponding to the received transmitted signal 202 is undefined. If $T_1$ (not shown) is defined as a portion of the period of the data signal received by the data terminals 116*a* and 116*b* during which the data signal is intended to convey a data value (for example, binary zero or one), and $T_2$ (not shown) is defined as the portion of a data signal period during which the OOK envelope detector 168 produces a valid output, then $T_1$ minus $T_2$ is referred to as the eye closure of the of the detector output 170. Eye closure reduces the duration of quiet periods 206. (This is visible in FIG. 2 as the shortening of quiet periods 206 to less than a half period.) This reduces signal-to-noise ratio of the transmitted signal 202, and of the output of the OOK digital isolator 100 to the first and second output terminals 178*a* and 178*b*.

As previously described, the data signals received by the OOK digital isolator 100 encode data with a frequency that is a data rate, and have a period that equals 1/data rate. Within a period of the data signal, the fraction of the data signal period that can have a relatively high voltage value (for example, corresponding to a logical value of one) is referred to as the duty cycle. The time within a single period during which a data signal has the relatively high voltage value is referred to as $T_{ON}$, and the time within the single period during which the data signal has a relatively low voltage value (for example, corresponding to the quiet period 206) is referred to as Torr. Accordingly, the duty cycle of the data signals can be expressed as shown in Equation 1:

$$\text{duty cycle} = \frac{T_{ON}}{T_{ON} + T_{OFF}} \qquad \text{Equation 1}$$

If the OOK digital isolator 100 functions ideally, then the duty cycles of the converter outputs 174*a* and 174*b* match the duty cycle of the data signals received from the data terminals 116*a* and 116*b*. However, multiple non-ideal factors give rise to eye closure, including duty cycle distortion (DCD). DCD measures change of a duty cycle from a corresponding designed duty cycle. For example, if a designed duty cycle is 50%, then DCD equals 50% minus the actual duty cycle. DCD, a type of data dependent jitter, contributes to eye closure, and accordingly, reduces signal-to-noise ratio (SNR) of the OOK digital isolator 100.

For data signals with a frequency equal to data rate; a period equal to $$\frac{1}{\text{data rate}};$$

and a duty cycle equal to 50%, the ideal duration of a signal packet 204 is $$\frac{1/2}{\text{data rate}}.$$

However, because $T_{fall}$ is greater than zero, signal packets 204 last longer than the ideal duration; quiet periods 206 are shortened; and SNR is decreased.

In some examples, various functional blocks in the OOK digital isolator 100 contribute to eye closure. Examples of eye closure contributors include: the CML to CMOS converter 126; process, voltage, or temperature variation of the LC oscillator 128 or the OOK modulator 132; sensitivity of the peak-to-peak amplitude of the OOK modulated outputs 134*a* and 134*b* to isolation channel gain and process, voltage, or temperature variation; sensitivity of the detector output 170 to variations in received transmitted signal 202 peak-to-peak voltage ($V_{RX\text{-}pk\text{-}pk}$); and p-channel metal-oxide-silicon field effect transistor (PMOS) to n-channel metal-oxide-silicon field effect transistor (NMOS) signal strength variation caused by process, voltage, or temperature variation in the single ended to differential converter 172.

The OOK modulator 132 reduces DCD by performing a closed loop DCD correction calibration process. An overview of the calibration process is provided first, for clarity. The transmitter side calibration circuitry 115 generates a signal with zero DCD, so that DCD in resulting outputs of the OOK digital isolator 100 will correspond to DCD caused by normal mode operation of the OOK digital isolator 100. The receiver side calibration circuitry 196 analyzes the resulting converter outputs 174*a* and 174*b* and provides a feedback loop to reduce DCD in the converter outputs 174*a* and 174*b* by adjusting a value of the DAC output 194 (which is connected to the detector 168 control input). The DAC output 194 is used by the OOK envelope detector 168 as a control signal that modifies a duty cycle of the OOK envelope detector output 170. In some examples, the calibration process is performed during power-on and is periodically rerun, such as during a resume from sleep mode period, when there are no data signals received by the data terminals 116*a* and 116*b*. The receiver side 104 of the OOK digital isolator 100 can be instructed to start and stop the calibration process using signals communicated across an isolation channel 322 (further described with respect to FIG. 3).

During calibration mode operation of the OOK digital isolator 100, the calibration enable terminal 106 provides a calibration enable signal with a value of ENABLE, turning on the calibration oscillator 108 and the CIVIL divider 112, and selecting the divider outputs 114*a* and 114*b* as outputs of the analog MUX 118. The calibration oscillator 108 generates a zero DCD clock signal with a frequency equal to the data rate and a period of $$\frac{1}{\text{data rate}}.$$

Data rate can be, for example, 2 GHz (2 Gbps). The CIVIL divider 112 divides this frequency by two, to produce a zero DCD calibration signal 208 (referring to FIG. 2) with frequency equal to half of the data rate (e.g., 0.5×data rate) and a period equal to $$\frac{2}{\text{data rate}}.$$

Because me calibration enable signal is enabled (e.g., it is set to the ENABLE value), the analog MUX 118 outputs the calibration signal 208. The OOK modulator 132 modulates the resulting control signal using the carrier wave signal with frequency Fref (for example—as previously discussed— 14.5 GHz) to generate a transmitted calibration signal 210 with peak-to-peak voltage $V_{TX\text{-}pk\text{-}pk}$, and transmits the transmitted calibration signal 210 across the isolation barrier 166.

The OOK envelope detector 168 receives the transmitted calibration signal 210 and detects calibration signal packets 212 and calibration quiet periods 214 to generate a recovered signal. The single ended to differential converter 172 converts the recovered signal to two differential signals, which will be referred to jointly as a differential recovered signal.

Figure 3:
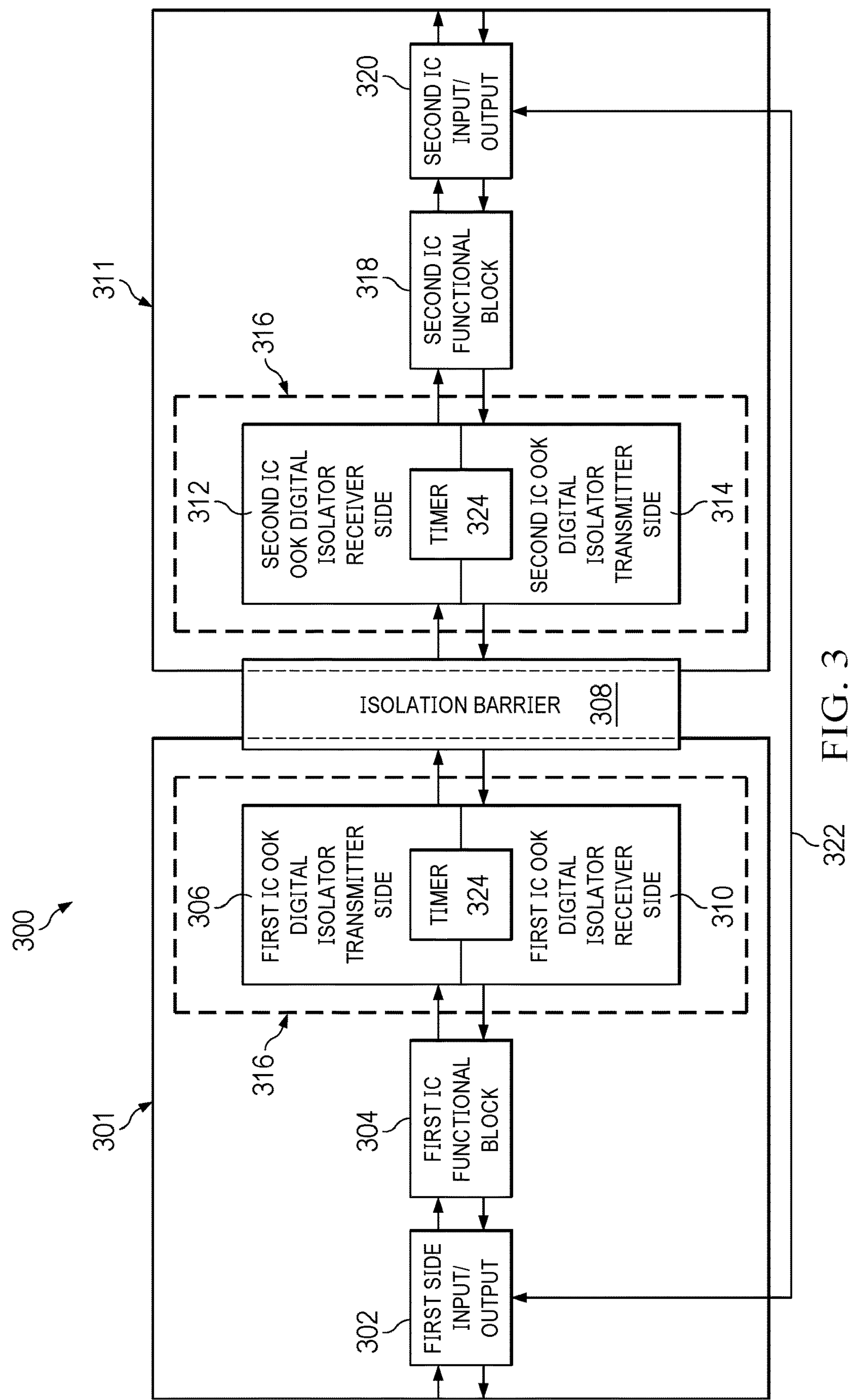
FIG. 3 shows an example block diagram of an integrated circuit.

The receiver side calibration circuitry 196 begins calibrating after receiving a signal instructing the receiver side calibration circuitry 196 to do so—for example, a signal corresponding to the calibration enable signal transmitted across a separate isolation channel 322 (FIG. 3). The preamplifier/comparator 184 determines whether a duty cycle of the differential recovered signal is greater than a designed duty cycle of the OOK digital isolator 100, corresponding to a positive DCD, or less than the designed duty cycle of the OOK digital isolator 100, corresponding to a negative DCD. To do so, the comparator compares an average voltage of the first differential converter output 174*a* to an average voltage of the second differential converter output 174*b*. Because the two converter outputs 174*a* and 174*b* are differential (complementary) signals, their average voltages will match if their duty cycles are 50%.

The digital controller 188 outputs an N bit control value, where N is a positive integer. For example, N is 8, so that the control value is from 0 through 255. If the preamplifier/comparator 184 determines that the DCD of the differential recovered signal is positive, then the digital controller 188 decrements the control value. If the preamplifier/comparator 184 determines that the DCD of the differential recovered signal is negative, then the digital controller 188 increments the control value. The digital controller 188 starts the control value at, for example, the control value most recently used during normal operation of the OOK digital isolator 100, or at a pre-determined initial value. The DAC 192 (for example, an 8 bit R2R resistor ladder) outputs a control signal (a voltage or current, for example, a current in the zero to ten milliamp range), with a value determined by the control value, that controls a voltage or current (respectively) of the OOK envelope detector 168 to proportionally adjust the duty cycle of the OOK 168 envelope detector's output waveform. For example, the calibration process can reduce duty cycle error from 2% to 0.2%, and can reduce eye closure from between 80 and 100 picoseconds to less than 10 picoseconds.

The receiver side calibration circuitry 196 completes or ceases calibration either after detecting that the control value has converged to one or more values (for example, is fixed at, is oscillating between or among, or is randomly traversing among three or fewer values). On detecting that the control value has converged to one or more values, the receiver side calibration circuitry 196 uses an average of the resulting value(s) as a final control value with which to control the OOK envelope detector 168 until a new calibration cycle is signaled. In some example embodiments, the receiver side calibration circuitry 196 selects a median value as a result, or another value derived from the convergence values.

In some embodiments, after reaching convergence, the average of the convergence values is taken as a first intermediate control value, and the calibration process is re-performed with a "flip" value asserted. The flip value is used to cause the preamplifier/comparator 184 to change its circuit configuration to invert the sign of the preamplifier/comparator's 184 offset voltage, without changing the magnitude of the offset voltage. The offset voltage of a comparator is the input voltage at which the comparator's output changes from one logic level to the other, and can be viewed as an error voltage. Accordingly, the comparator's output will be skewed in favor of one of its inputs by an amount corresponding to the offset voltage. With respect to the receiver side calibration circuitry 196, this means that the first intermediate control value will be skewed from an ideal result—a control value calibrating the OOK envelope detector 168 to produce a detector output 170 with a duty cycle matching designed specifications (within design limitations). This skew will be in a direction (positive or negative) and have a magnitude corresponding to the preamplifier/comparator's 184 offset voltage.

By re-performing the calibration process with the preamplifier/comparator's 184 offset voltage inverted, a second intermediate control value is generated. The second intermediate control value will be skewed from the ideal result in an opposite direction from the first intermediate control value, with an equal magnitude of skew. The first and second intermediate control values can be averaged to produce a final, deskewed control value. Also, the difference between the first intermediate control value and the deskewed control value can be stored in memory as a measure of control value skew (a skew measure) corresponding to the preamplifier/comparator's 184 offset voltage.

Re-performance of the calibration process starts at the first intermediate control value, and completes when the process converges to one or more values (as described with respect to obtaining the first intermediate control value). The first intermediate control value, resulting from flip being asserted, and the second intermediate control value, resulting from flip not being asserted, are averaged to produce a final control value.

In some embodiments, the calibration process is re-performed with the flip value asserted only when a relatively long time is available to complete the calibration process, such as during some types of power-on or resume process. In some embodiments, a stop calibration signal causes a calibration process to stop early, before converging on a final control value, and the last controller output 190 (the last control value determined by the interrupted calibration process) is used as the first intermediate control value. When insufficient time is available for repeated execution, or when the calibration process stops early, the skew measure is used to adjust (deskew) the first intermediate control value.

The receiver side calibration circuitry 196 can also cease calibration after receiving a halt signal or a deactivation of the receiver side begin calibration signal, or after a timer 324 in the receiver side calibration circuitry 196 has elapsed. A cessation signal can be sent, for example, after or in anticipation of an end to a resume from sleep mode period, or after a timer 324 in the transmitter side calibration circuitry 115 has elapsed. After calibration is halted in this manner, the last-updated control value is used as the control value for the OOK envelope detector 168.

FIG. 3 shows an example block diagram of an integrated circuit system 300. In a first IC 301, a first IC input/output (I/O) block 302 receives input from, and outputs to, elements outside the first IC 301. A first IC functional block 304 receives input from, and outputs to, the first IC I/O block 302. A first IC OOK digital isolator transmitter side 306 receives input from the first IC functional block 304 and outputs to second IC OOK digital isolator receiver side 312 via an isolation barrier 308. A first IC OOK digital isolator receiver side 310 receives input from the isolation barrier 308 and control input (such as calibration start and stop signals) from the first IC functional block 304 and outputs to the first IC functional block 304. In a second IC 311, a second IC OOK digital isolator receiver side 312 receives input from the isolation barrier 308 and control input from a second IC functional block 318 and outputs to the second IC functional block 318. A second IC OOK digital isolator transmitter side 314 receives input from the second IC functional block 318 and outputs to first IC OOK digital isolator receiver side 310 via the isolation barrier 308. The second IC functional block 318 receives input from and outputs to a second IC I/O block 320. The second IC I/O block 320 receives input from, and outputs to, elements that are outside the second IC 311 and electronically isolated from the first IC 301 and the elements with which the first IC I/O block 302 communicates. A separate isolation channel 322 communicatively connects the first IC I/O block 302 to the second IC I/O block 320 (for example, so that calibration start and stop signals can be communicated from the first IC's 301 side of the isolation barrier 308 to the second IC's 311 side of the isolation barrier 308, or vice versa).

Together, the first IC OOK digital isolator transmitter side 306 and the first IC OOK digital isolator receiver side 310 comprise an OOK digital isolation transceiver 316; and the second IC OOK digital isolator receiver side 314 and the second IC OOK digital isolator transmitter side 312 comprise an OOK digital isolation transceiver 316. The OOK digital isolation transceiver 316 on the first IC 301 and the OOK digital isolation transceiver 316 on the second IC 311 each includes a timer 324 shared between the respective OOK digital isolator transmitter and receiver sides (306 and 310, or 314 and 312). Each direction of transmission and reception of OOK digital isolator can comprise an OOK digital isolator 100 as shown in FIGS. 1A and 1B (the first IC OOK digital isolator transmitter side 306, the isolation barrier 308, and the second IC OOK digital isolator receiver side 312; and the second IC OOK digital isolator transmitter side 314, the isolation barrier 308, and the first IC OOK digital isolator receiver side 310). ICs including OOK digital isolation transceivers 316 as shown in FIG. 3, and as further explained with respect to FIGS. 1A, 1B, and 2, can be used to implement, for example, USB controllers compliant to the ISOUSB211 standard, as well as for other high speed isolated LVDS transceiver applications. In some example embodiments, circuitry similar to (or the same as) transmitter circuitry 102 can be used to implement transmitter 306 and/or transmitter 314. In some example embodiments, circuitry similar to (or the same as) receiver 104 can be used to implement receiver 310 and/or receiver 312.

FIG. 4 shows an example process 400 for transmitting data through the OOK digital isolator 100 of FIGS. 1A and 1B. In step 402, the analog MUX 118 selects the data signals or the calibration signal 208 to output, in response to whether the calibration enable signal is activated (ENABLE) or inactivated (/ENABLE). In step 404, the LC oscillator 128 generates a carrier wave signal having a reference frequency. In step 406, the OOK modulator 132 generates a transmitted signal 202 by modulating a control signal derived from either the data signals or the calibration signal 208 using the carrier wave signal. In step 408, the OOK modulator 132 transmits the transmitted signal 202 across the isolation barrier 166 to OOK envelope detector 168. In alternative example embodiments, transmission of data and/or control signals can occur across the isolation barrier 166 in either direction (as shown with respect to FIG. 3).

In step 410, the OOK envelope detector 168 receives the transmitted signal 202 from the isolation barrier 166 as a received transmitted signal 202. In step 412, the OOK envelope detector 168 detects signal packets 204 and quiet periods 206 to generate a recovered signal.

In step 414, the receiver side calibration circuitry 196 begins calibrating after receiving a calibration start signal via a separate isolation channel. In step 416, the preamplifier/comparator 184 detects a duty cycle of the recovered signal. In step 418, the preamplifier/comparator 184 compares the detected duty cycle to a designed duty cycle, determining whether a DCD of the recovered signal is positive (the detected duty cycle is greater than the designed duty cycle) or negative (the detected duty cycle is less than the designed duty cycle). In step 420, the digital controller 188 and DAC 192 control the OOK envelope detector 168 to increase the duty cycle of the recovered signal if the determined DCD of the recovered signal is negative, and to decrease the duty cycle of the recovered signal if the determined DCD of the recovered signal is positive, by increasing or decreasing a control value. In step 422, calibration concludes after the control value converges to one or more repeated values, and a first intermediate control value is generated. In step 424, calibration is repeated with the flip value asserted to generate a second intermediate control value. The first and second intermediate control values are averaged to generate a final, unskewed control value.

Modifications are possible in the described embodiments, and other embodiments are possible, within the scope of the claims.

Some circuit portions are described herein as using CML or CMOS structure. In some embodiments, circuit types other than CML or CMOS are used for respective circuit portions.

In some embodiments, an oscillator other than an LC oscillator is used.

In some embodiments, some or all of the isolation capacitors have different capacitances.

The output of the analog MUX is sometimes referred to herein as the target signal, because it is corresponds to the signal that the OOK modulator modulates with the carrier wave signal to generate the transmitted signal.

In some embodiments, the preamplifier/comparator determines a DCD of the recovered signal.

In some embodiments, the frequency of the calibration signal is different from 0.5 times the data rate.

In some embodiments, incrementing the control value (the DAC output value) reduces the duty cycle of the OOK envelope detector and decrementing the control value increases the duty cycle of the OOK envelope detector.

In some embodiments, the digital controller can increment or decrement the control value by more than one. In some embodiments, the digital controller uses a binary search (or other search) or a lookup table to determine how much to increment or decrement the control value.

In some embodiments, LVDS input and output data signals follow the LVDS technical standard. In some embodiments, input and output data signals deviate from the LVDS technical standard or use a different low-distortion signal format.

In some embodiments, a designed duty cycle is other than 50%. In some such embodiments, the preamplifier/comparator uses, for example, resistor dividers to adjust average converter output signal voltages so that they will match if their respective (complementary) duty cycles match the designed duty cycles.

In some embodiments, timers are located elsewhere in an IC system that includes one or more OOK digital isolator transceivers than described above. In some embodiments, calibration start and end signals originate elsewhere in an IC system that includes one or more OOK digital isolator transceivers than described above.

In some embodiments, a first digital isolator on a first die and a second digital isolator on a second die each receive signals that indicate which digital isolator is to act as a transmitter and which is to act as a receiver during a certain period. For example, corresponding signals can be generated in response to a fixed pin on a third die, and transmitted so that one or both of the first and second digital isolators receive the corresponding signals via a separate isolation channel.

The term "couple" may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the example embodiment of FIG. 3 suggests that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in and/or over a semiconductor substrate; (ii) incorporated in a single semiconductor package; (iii) incorporated into the same module; and/or (iv) incorporated in and/or on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

What is claimed is:

1. An on-off keying (OOK) digital isolation transceiver, the transceiver comprising:

a transmitter side calibration circuitry including a calibration signal output, the transmitter side calibration circuitry configured to output a calibration signal;

a multiplexer including an isolator input, a calibration signal input, a calibration enable input, and a multiplexer output, the isolator input adapted to receive a data signal, the calibration signal input coupled to the calibration signal output, and the calibration enable input adapted to receive a calibration enable signal, the multiplexer configured to output a signal corresponding to one of the isolator input or the calibration signal input in response to the calibration enable signal;

an OOK modulator including a modulator input and a modulator output, the modulator input coupled to the multiplexer output, the OOK modulator configured to selectively output a transmitted signal having a reference frequency in response to a value of the modulator input corresponding to an on state or an off state of the OOK modulator;

an OOK envelope detector including a detector input, a control input, and a detector output, the OOK envelope detector configured to:

output a signal having a first value in response to detecting a signal received via an isolation barrier;

output a signal having a second value in response to not detecting the signal received via the isolation barrier; and change a duty cycle of the detector output in response to the control input; and a receiver side calibration circuitry including a calibration input and a control output, the calibration input coupled to the detector output, the control output coupled to the control input, the receiver side calibration circuitry configured to detect a duty cycle distortion (DCD) of the detector output and to output the control output in response to the detected DCD.

2. The OOK digital isolation transceiver of claim 1, wherein the calibration signal has zero DCD.

3. The OOK digital isolation transceiver of claim 1, wherein the receiver side calibration circuitry includes a comparator having an offset voltage; and wherein the receiver side calibration circuitry is configured to perform a calibration process to generate a first intermediate control output, to repeat the calibration process after inverting a sign of the comparator's offset voltage without changing a magnitude of the comparator's offset voltage to generate a second intermediate control output, and to average the first intermediate control output and the second intermediate control output to generate a final control output.

4. The OOK digital isolation transceiver of claim 1, wherein the receiver side calibration circuitry is configured to detect whether the duty cycle of the detector output is greater than a designed duty cycle of the detector output (positive DCD) or less than the designed duty cycle of the detector output (negative DCD), to output a control signal configured to cause the OOK envelope detector to reduce the duty cycle of the detector output in response to a positive DCD, and to output a control signal configured to cause the OOK envelope detector to increase the duty cycle of the detector output in response to a negative DCD.

5. The OOK digital isolation transceiver of claim 1, wherein the receiver side calibration circuitry outputs a control signal configured to cause the OOK envelope detector to reduce the duty cycle of the detector output by reducing or increasing an integer N bit value of the control signal; and wherein the receiver side calibration circuitry outputs a control signal configured to cause the OOK envelope detector to increase the duty cycle of the detector output by performing a reducing or increasing of the N bit value of the control signal that is an opposite of the reduction of the duty cycle.

6. The OOK digital isolation transceiver of claim 1, wherein a control signal is configured to increase or decrease a duty cycle of the detector output by causing the envelope detector to change a voltage or a current of the detector output in response to a change in a voltage or a current, respectively, of the control signal.

7. The OOK digital isolation transceiver of claim 1, further including a single ended to differential converter including a converter input and two differential converter outputs, the converter input coupled to the detector output.

8. An integrated circuit, comprising:

an on-off keying (OOK) envelope detector including a detector input, a control input, and a detector output, and configured to output a signal having a first value in response to detecting a signal received via an isolation barrier, and to output a signal having a second value in response to not detecting the signal received via the isolation barrier, wherein the OOK envelope detector is configured to change a duty cycle of the detector output in response to the control input; and a receiver side calibration circuitry including a calibration input and a control output, the calibration input coupled to the detector output, the control output coupled to the control input, the receiver side calibration circuitry configured to detect a duty cycle distortion (DCD) of the detector output and to output the control output in response to the detected DCD.

9. The integrated circuit of claim 8, wherein the receiver side calibration circuitry includes a comparator having an offset voltage; and wherein the receiver side calibration circuitry is configured to perform a calibration process to generate a first intermediate control output, to repeat the calibration process after inverting a sign of the comparator's offset voltage without changing a magnitude of the comparator's offset voltage to generate a second intermediate control output, and to average the first intermediate control output and the second intermediate control output to generate a final control output.

10. The integrated circuit of claim 8, further including:

a transmitter side calibration circuitry including a calibration signal output and configured to output a calibration signal;

a calibration enable terminal adapted to receive a calibration enable signal;

a multiplexer including an isolator input, a calibration signal input, a calibration enable input, and a multiplexer output, the isolator input adapted to receive a data signal, the calibration signal input coupled to the calibration signal output, and the calibration enable input coupled to the calibration enable terminal, the multiplexer configured to output a signal corresponding to one of the isolator input or the calibration signal input in response to the calibration enable input; and an OOK modulator including a modulator input and a modulator output, the modulator input coupled to the multiplexer output, the OOK modulator configured to output or not to output a transmitted signal having a reference frequency in response to a value of the modulator input corresponding to, respectively, an on state or an off state of the OOK modulator.

11. The integrated circuit of claim 8, wherein the receiver side calibration circuitry is configured to detect whether the duty cycle of the detector output is greater than a designed duty cycle of the detector output (positive DCD) or less than the designed duty cycle of the detector output (negative DCD), to output a control signal configured to cause the OOK envelope detector to reduce the duty cycle of the detector output in response to a positive DCD, and to output a control signal configured to cause the OOK envelope detector to increase the duty cycle of the detector output in response to a negative DCD.

12. The integrated circuit of claim 8, wherein the receiver side calibration circuitry outputs a control signal configured to cause the OOK envelope detector to reduce the duty cycle of the detector output by reducing or increasing an integer N bit value of the control signal; and wherein the receiver side calibration circuitry outputs a control signal configured to cause the OOK envelope detector to increase the duty cycle of the detector output by performing a reducing or increasing the N bit value of the control signal that is an opposite of the reduction of the duty cycle.

13. The integrated circuit of claim 8, wherein a control signal is configured to increase or decrease a duty cycle of the detector output by causing the envelope detector to change a voltage or a current of the detector output in response to a change in a voltage or a current, respectively, of the control signal.

14. The integrated circuit of claim 8, further comprising a single ended to differential converter including a converter input and two differential converter outputs, the converter input coupled to the detector output.

15. A method for digital signal isolation, the method comprising:

utilizing a digital isolator transmitter side circuitry:

selecting a data input signal or a calibration signal as a target signal in response to whether a calibration enable signal is activated;

generating a carrier wave signal having a reference frequency;

modulating, utilizing an on-off keying (OOK) modulator, the target signal utilizing the the carrier wave signal to generate a transmitted signal;

transmitting the transmitted signal across an isolation barrier;

receiving the transmitted signal from the isolation barrier as a received signal; and utilizing a digital isolator receiver side circuitry:

detecting, utilizing an OOK envelope detector, portions of the transmitted signal that include the carrier wave signal to generate a recovered target signal; and in response to receiving a calibration start signal:

detecting a duty cycle of the recovered target signal;

comparing the detected duty cycle to a designed duty cycle; and controlling the OOK envelope detector to increase or decrease the duty cycle of the recovered target signal in response to the comparing.

16. The method for digital signal isolation of claim 15, wherein the detecting, the comparing, and the controlling together comprise a calibration process; and wherein the comparing is performed by a comparator having an offset voltage;

further comprising:

performing the calibration process to generate a first intermediate control output used to perform the controlling;

inverting a sign of the comparator's offset voltage without changing a magnitude of the comparator's offset voltage;

after the inverting, repeating the calibration process to generate a second intermediate control output used to perform the controlling; and averaging the first intermediate control output and the second intermediate control output to generate a final control output used to perform the controlling.

17. The method for digital signal isolation of claim 15, wherein the calibration signal has a frequency of one-half times a data rate of a data signal.

18. The method for digital signal isolation of claim 15, wherein the detecting a duty cycle detects whether the duty cycle of the recovered target signal is greater than the designed duty cycle (positive DCD) or less than the designed duty cycle (negative DCD); and wherein the controlling causes the OOK envelope detector to reduce the duty cycle of the recovered target signal in response to a positive DCD, and causes the OOK envelope detector to increase the duty cycle of the recovered target signal in response to a negative DCD.

19. The method for digital signal isolation of claim 15, wherein the controlling controls the OOK envelope detector to reduce a duty cycle of the recovered target signal by reducing or increasing an integer N bit value of a control signal; and wherein the controlling controls the OOK envelope detector to increase a duty cycle of the recovered target signal by performing a reducing or increasing of the N bit value of the control signal that is an opposite of the reduction of the duty cycle.

20. The method for digital signal isolation of claim 15, wherein the controlling increases or decreases a duty cycle of the recovered target signal by causing the envelope detector to change a voltage or a current of the detector output in response to a change in a voltage or a current, respectively, of a control signal.

* * * * *